United States Patent [19]
Daly et al.

[11] Patent Number: 6,100,596
[45] Date of Patent: Aug. 8, 2000

[54] CONNECTORIZED SUBSTRATE AND METHOD OF CONNECTORIZING A SUBSTRATE

[75] Inventors: John J. Daly, Chicago; Robert Skepnek, Norridge, both of Ill.

[73] Assignee: Methode Electronics, Inc., Chicago, Ill.

[21] Appl. No.: 08/616,471

[22] Filed: Mar. 19, 1996

[51] Int. Cl.⁷ .......................... H01L 23/48; H01L 23/52; H01L 29/40; H01L 23/34

[52] U.S. Cl. .................. 257/779; 257/772; 257/723; 257/724; 257/693

[58] Field of Search .................... 257/779, 778, 257/780, 772, 723, 724, 737, 730, 693, 781

[56] References Cited

U.S. PATENT DOCUMENTS

| | | | |
|---|---|---|---|
| 4,132,341 | 1/1979 | Bratschun | 228/122 |
| 5,118,027 | 6/1992 | Braun et al. | 228/180 |
| 5,224,021 | 6/1993 | Takada et al. | 257/696 |
| 5,241,133 | 8/1993 | Mullen, III et al. | 257/693 |
| 5,488,200 | 1/1996 | Tsukada | 174/261 |
| 5,489,750 | 2/1996 | Sakemi et al. | 174/261 |
| 5,492,266 | 2/1996 | Hoebener et al. | 427/123 |
| 5,561,323 | 10/1996 | Andros et al. | 257/706 |
| 5,569,960 | 10/1996 | Kumagawa et al. | 257/738 |
| 5,571,593 | 11/1996 | Arldt et al. | 428/131 |
| 5,598,036 | 1/1997 | Ho | 257/780 |
| 5,600,257 | 2/1997 | Leas et al. | 324/754 |

FOREIGN PATENT DOCUMENTS 0 641 038 A2  1/1995  European Pat. Off. .

*Primary Examiner*—Mahshid D. Saadat
*Assistant Examiner*—Jhihan B. Clark
*Attorney, Agent, or Firm*—David L. Newman

[57] ABSTRACT

A connectorized substrate and method of connectorizing a substrate is provided, including a substrate having conductive traces mounted thereon and solder paste connected to the conductive traces and conductive spheres mounted to the solder paste. The connectorized substrate of the present invention may be used to provide for components to be added to a motherboard such as a resistor network by mounting resistors to the conductive traces of the substrate such as thick-film ceramic resistors.

8 Claims, 4 Drawing Sheets

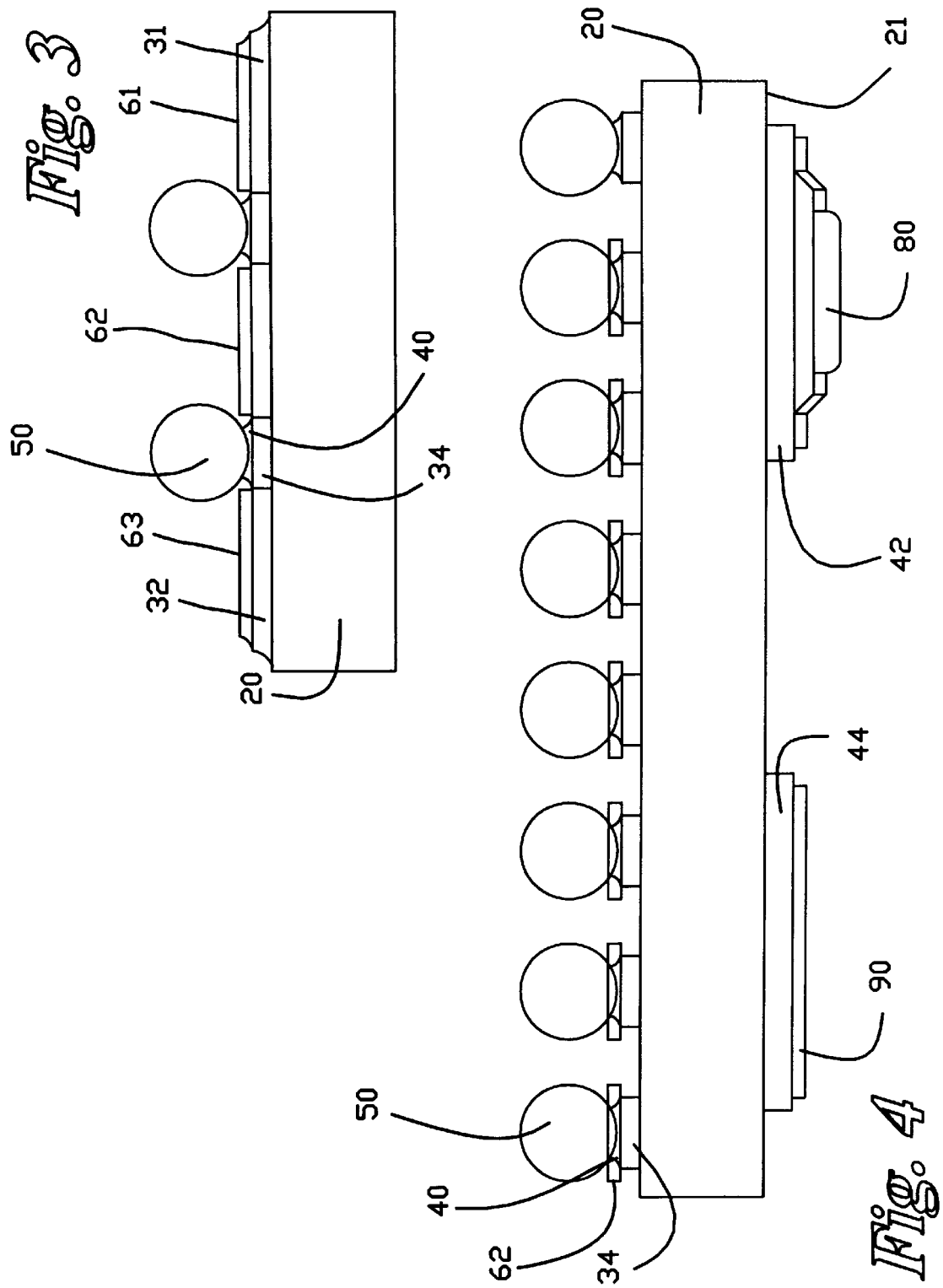

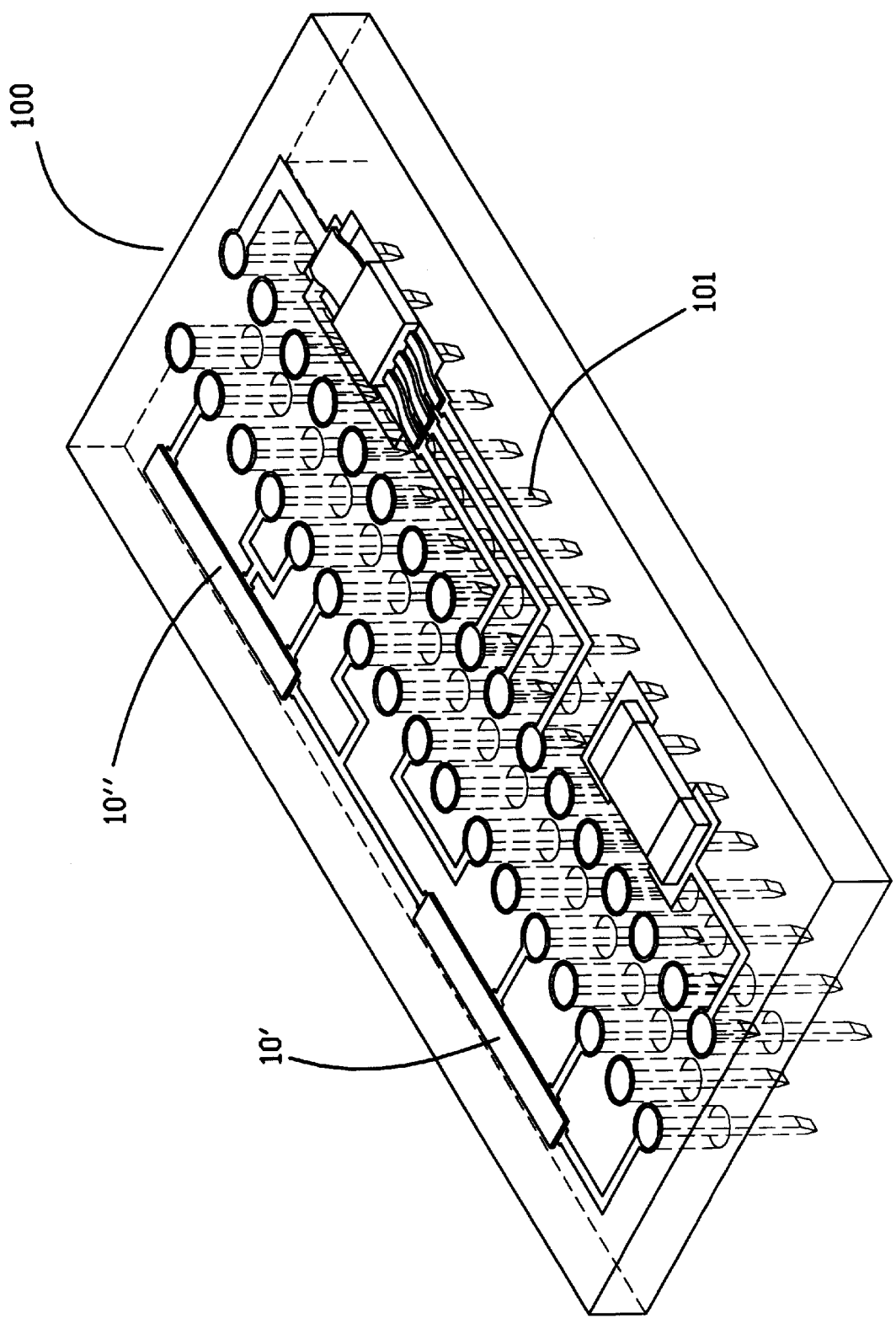

CONNECTORIZED SUBSTRATE AND METHOD OF CONNECTORIZING A SUBSTRATE

BACKGROUND OF THE INVENTION

The present invention relates to a connectorized substrate and method of connectorizing substrate and, in particular, a substrate having conductive areas and conductive spheres attached to the conductive areas in order to provide for electrical connection of the substrate to a motherboard.

The use of conductive spheres is known in the art for providing high density leads. For example, ball grid array packages are known for attaching the die of an integrated circuit to a printed circuit board. Such BGA packages are common having two-hundred and fifty-six balls on 0.050 inch×0.050 grids using 0.031/0.039 inch ball diameters, such as Jedec MO-156. However, such packages have been limited in their use for carrying IC or chips in order to accommodate the high density requirements.

Many substrates have conductive pads on their surfaces in order to allow for the quick attachment of the substrate to a motherboard. Such attachment is via surface mount (SMT) technology, where the conductive pad is oriented above a predetermined conductive area on the motherboard. Upon positioning of the substrate over the motherboard and reflow of the solder pad, an electrical connection may be made. Such conductive pads do not assimilate the contraction or expansion of the substrate and the motherboard due to temperature variations due to the different coefficient of expansion of the various substrates. In addition, traditional surface mount techniques do not provide an offset between the substrate and the motherboard in order to allow for inspection of the electrical connection or washing of the substrates.

Therefore, it is an object of the present invention to provide a connectorized substrate which provides for the quick and easy attachment of a substrate to a motherboard and provides for the assimilation of the different rates of expansion of the substrate materials and provides for an offset between the substrate and the motherboard.

It is another object of the present invention to provide for a substrate which may be quickly and easily attached to a motherboard.

It is a further object of the present invention to provide a method of making electrical connections between a substrate and a motherboard which assimilates the expansion differences of the substrate materials and provides for an offset between the substrate and the motherboard.

It is another object of the present invention to provide for a method of connectorizing a substrate wherein multiple electrical connectors may be mounted to a substrate quickly and inexpensively.

SUMMARY OF THE INVENTION

A principal object of this invention is to provide a connectorized substrate comprising a substrate, conductive traces mounted on the substrate, solder paste attached to the conductive traces and conductive spheres mounted to the high temperature solder paste. The solder paste may have a melting point between 400° F. and 425° F. The conductive spheres may have a composition of approximately five to fifteen percent tin and eighty-five to ninety-five percent lead. The substrate may include a resistor network. The resistor network may comprise thick-film resistors connected to the conductive traces of the substrate.

In an embodiment, a connectorized resistor network is provided comprising a ceramic substrate, conductive traces carried by the substrate, conductive paste mounted to the substrate connected to the conductive traces, solder paste connected to the conductive pads, the solder paste formed of high temperature solder paste having a melting point of between 400° F. and 425° F., a resistor network carried by the substrate connected to the conductive pads, the resistor network comprising thick-film resistors screened onto the substrate and conductive spheres mounted to the solder paste in order to connect the resistor network to a motherboard having solder pads thereon in order to receive the conductive spheres of the resistor network. The conductive spheres may have a composition of approximately ten percent tin and approximately ninety percent lead. The conductive spheres may have a diameter of 0.035 inches ±0.002 inches.

In an embodiment, a method of connectorizing a substrate includes the steps of forming a substrate having a conductive network, mounting conductive pads on the substrate connected to the conductive network, mounting solder paste to the conductive pads, mounting conductive spheres to the solder paste and reflowing the solder paste in order to connect the conductive spheres to the conductive pads. The method may include the steps of screen printing conductive traces onto the substrate. The method may include the steps of mounting a resistor network on the substrate connected to the conductive network. The method wherein the mounting of the conductive spheres to the substrate includes the steps of forming a template having an array of holes corresponding to the locations of the solder paste deposits of the substrate, placing conductive spheres in the holes of the template, placing the substrate over the template and onto the conductive spheres so that the spheres are aligned with the solder paste deposits of the substrate, inverting the assembly so that the template is above the conductive spheres which are above the substrate and exposing the substrate to heat in order to reflow the solder paste to connect to the conductive spheres. The method may comprise the further steps of attaching the substrate to a motherboard by inverting the substrate so that the conductive balls are adjacent solder pads of the motherboard and exposing the motherboard to heat in order to reflow the solder pads of the motherboard to connect to the conductive spheres of the substrate.

These and other features of the invention are set forth below in the following detailed description of the presently preferred embodiments.

BRIEF DESCRIPTION OF THE DRAWINGS

FIG. 3 is a side cut-away view of FIG. 2 taken at line 3—3;

FIG. 4 is a side elevation cut-away view of FIG. 2 taken at line 4—4; and

FIG. 5 is a perspective view of a motherboard assembly having an embodiment of the present invention mounted thereto.

DETAILED DESCRIPTION OF THE PRESENTLY PREFERRED EMBODIMENTS

Figure 1:
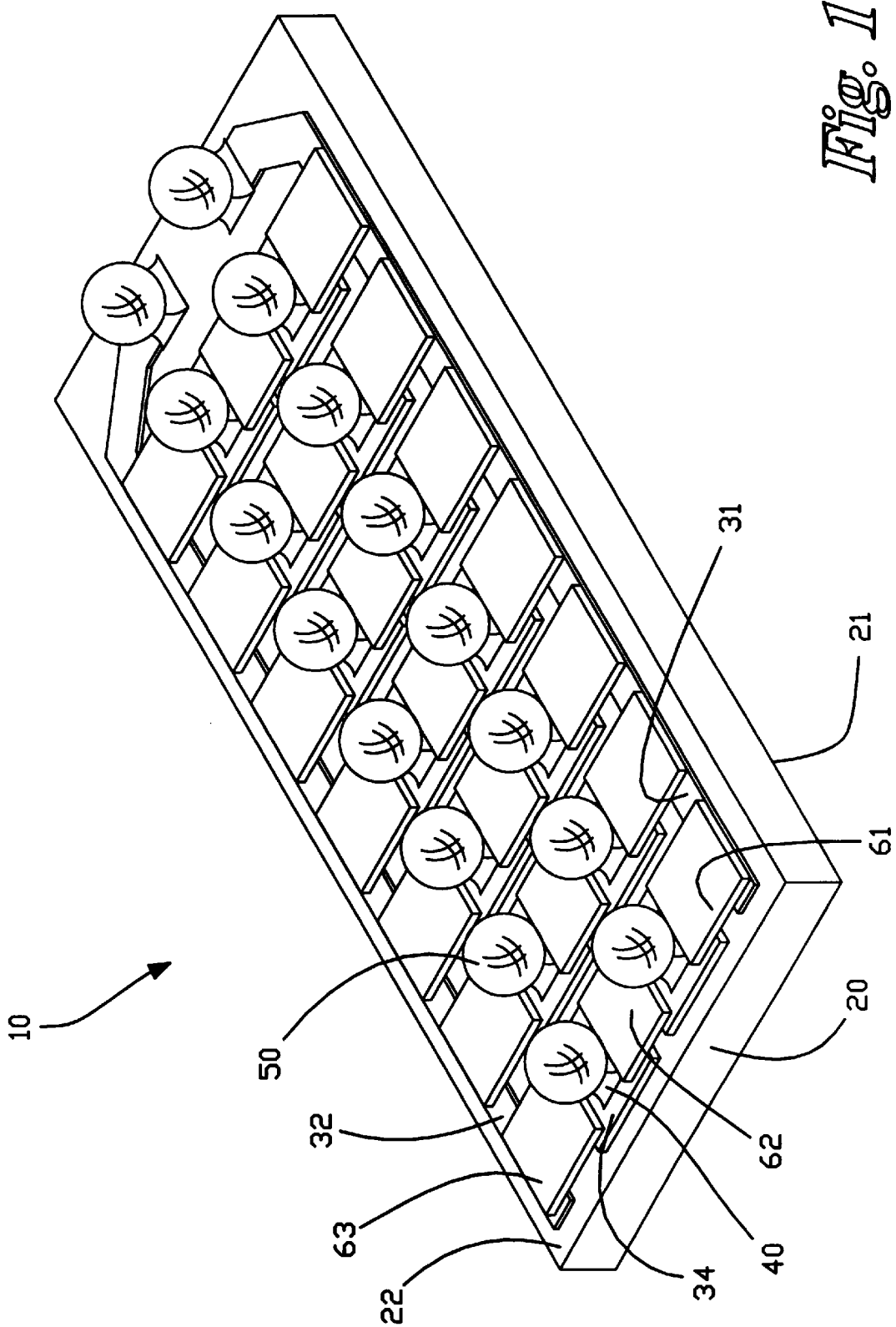
FIG. 1 is a perspective of an embodiment of the present invention showing the bottom side of the connectorized substrate.

The present invention is best understood by reference to FIGS. 1–5. FIG. 1 is a perspective view of a preferred embodiment of the present invention which is a connectorized substrate 10. In the preferred embodiment, the connectorized substrate 10 is a ceramic thick-film resistor network. However, any substrate providing for any variety of functions may be connectorized according to the present invention. The substrate 20 may be any dielectric material such as ceramic, FR4, or plastic. In the preferred embodiment, a ceramic substrate of ninety-six percent alumina is used having a thickness of 0.025 inches. The substrate 20 includes embedded therein a network of conductive traces and include traces 31,32 on the second side 22 of the substrate 20. The traces 31,32 may be adhered to the substrate using a screen printing process, however, any method such as vacuum deposition or pad printing process, screen printing, brush, roller, spraying, dipping, masking, vacuum plating or any combination thereof may be used. Simultaneous to forming the conductive traces 31,32, conductive pads 34 are also adhered to the second side 22 of the substrate 20. Adhered on the conductive pad 34 is a solder paste deposit 40 and mounted to the solder paste 40 is conductive sphere 50. The attachment of the conductive sphere 50 to the conductive network of the substrate 20 provides for a connectorized substrate 10 which may perform a multitude of functions and which may then easily be mounted to a motherboard. Individual components may be attached to either the first side 21 or the second side 22 of the substrate 20, such as by die attachment or via surface mounting of the component to conductive pads 34 on the substrate 20. In the preferred embodiment, a resistor network is provided and an array of resistors 61,62,63 is provided. In a preferred embodiment, the resistors are thick-film resistors adhered to the substrate between the pairs of conductive pads 34 and the conductive traces 31, 32. The thick-film resistors are screen printed onto the substrate. The thick-film resistors are then trimmed using a laser trimming operation in order to attain the desired resistivity level of each individual resistor 61,62, 63 or the entire resistor network.

The attachment of the conductive spheres 50 to the substrate may be accomplished by various methods. In a preferred embodiment, a template is formed having an array of holes placed therein corresponding to the location of the conductive pads 34 of the substrate 20 and to which the conductive spheres 50 will be attached. The conductive spheres 50 are placed on the template. In a preferred embodiment, the conductive spheres have a diameter of 0.035 inches ±0.002 inches. The template includes an array of holes, each having a diameter equal to or less than the diameter of the conductive spheres. In a preferred embodiment, the template has holes of a diameter of 0.034 inches. Thus, when the balls are placed on the template, they will be seated properly in the holes but will not pass through. The substrate to which the conductive spheres will be attached is then placed over the conductive spheres and positioned thereon via the edges of the template which are a predetermined distance from the array of holes. Thus, the assembly provides for the conductive spheres being sandwiched between the template on one side and the substrate on another. The template may be formed of any material which maintains its shape and rigidity during repeated exposure to high temperatures. For example, aluminum or liquid crystal polymer. The assembly is then flipped so that the substrate is on the bottom and that template is on the top, so that gravity pulls the conductive spheres down onto the solder pads 40 of the substrate. The assembly is then exposed to heat in order to reflow the solder pad. In a preferred embodiment, the solder paste 40 of the substrate will reflow at high temperatures, for example, between 400° F. to 425° F. As the solder paste deposits are screened onto the substrate providing for a precise location of the solder paste upon reflow, the conductive sphere will readjust its location according to solder paste deposit so that it is precisely located on the substrate.

An alternate method of placing the conductive spheres onto the substrate may include placing the conductive spheres onto a first template having an array of holes having a diameter equal to or greater than the diameter of the conductive spheres. The conductive spheres are placed in the holes of the first template and have a second template placed beneath the first template offset so the spheres rest on the perimeter surface adjacent the holes of the second template. The second template also has an array of holes which have a diameter equal to or greater than the diameter of the conductive spheres. The second template may be offset by approximately 0.015 inches. The assembly having the conductive spheres seated in the holes of the first template and sitting on the second template is then placed over the substrate so that the holes of the first template are aligned with the solder paste deposits 40 of the substrate. The template assembly is located above the substrate so that a space is maintained of approximately 0.010 inch to 0.025 inch between the surface of the substrate and the second template. The second template is then slid so that the holes of the second template are aligned with the holes of the first template and the conductive spheres may then drop into and through the holes of the second template. The conductive spheres drop through the holes of the second template and onto the corresponding solder paste deposits of the substrate below. The solder pad has a viscosity of 940 Brookfield KCPS so that the surface tension holds the conductive spheres in position on each individual solder paste deposit. The templates may then be removed and the substrate having the conductive spheres thereon may be exposed to heat such as via a vapor phase oven in order to reflow the solder in order to form a secure, rigid attachment of the conductive spheres to the substrate. As discussed above, any mislocation of the conductive spheres on the solder paste deposits will be readjusted upon reflow in order to align the conductive spheres according to the predetermined positioning of the solder paste deposits on the substrate.

The method of forming the connectorized substrate as discussed above may be performed by forming batches of substrates. Each desired connectorized substrate 10 may include a small amount of conductive spheres. For example, as shown in FIG. 1, each connectorized substrate 10 includes two rows of eight conductive spheres. However, according to the method above, many batches of these connectorized substrates will be formed simultaneously. For example, the preferred size of the substrate as shown in FIG. 1 is approximately 0.20 inches X 0.40 inches. Two hundred of each of these substrate units may be made simultaneously by adhering the conductive traces to a ceramic sheet having dimensions of 4.0 inches X 4.0 inches. Thirty-two hundred conductive spheres may then be attached to the multiple substrate areas according to the procedures above. After reflow of the solder pads, the ceramic substrate may be separated into individual connectorized substrate units.

Such connectorized substrate units may then be attached to a motherboard as shown in FIG. 5. The motherboard will have solder pads attached thereto corresponding to the arrangement of the array of conductive spheres attached to the substrate 20. In a preferred embodiment, the solder paste on the motherboard will be low temperature solder paste having a melting point of between 325° F. and 350° F. In this way, upon exposure of the connectorized substrate 10 and the motherboard to temperatures sufficient to reflow the solder paste of the motherboard, only the solder pads of the motherboard will reflow, as high temperature solder paste was used to connect the conductive spheres to the substrate. In addition, in a preferred embodiment, the conductive spheres have a composition of ten percent tin and ninety percent lead. Such conductive spheres are relatively hard and also will not reflow under such conditions. The conductive spheres in a preferred embodiment have a higher melting point than the solder paste used and also the solder paste to connect the conductive spheres to the motherboard and also to connect to the conductive spheres to the substrate 20. Such conductive spheres are available from Alpha Metals, Inc. (Jersey City, N.J.).

Figure 2:
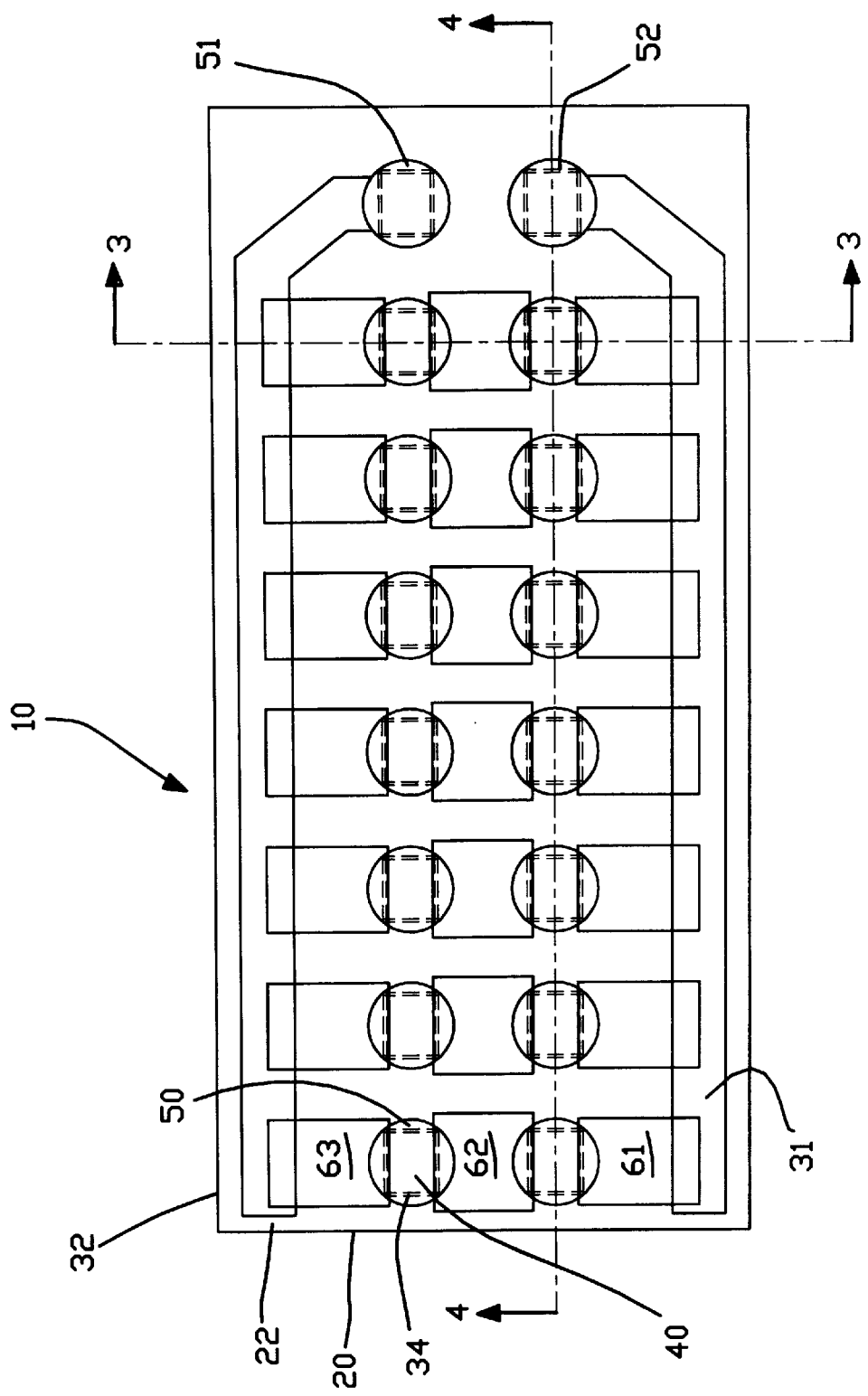
FIG. 2 is a plan view of the connectorized substrate of FIG. 1.

FIG. 2 is a plan view of the connectorized substrate 10 of FIG. 1. Conductive traces 31,32 are adhered to the second side 22 of the substrate 20. Conductive pads 34 are also adhered at the same time to the substrate 20. In a preferred embodiment, the conductive pads 34 may be a silver composition. The conductive traces 31,32 may be a conductive ink such as DuPont Paladium Silver 6130 (Wilmington, Del.). Solder pads 40 are placed on the conductive pads 34 and the conductive spheres 50 are mounted to the solder pads 40. Resistors 61,62,63 are placed between the conductive traces 31,32 and the conductive pads 34 in order that an electrical current may flow along each row of resistors 61,62,63. The resistors are trimmed to a predetermined resistance level so that the desired electrical current may be achieved along the entire resistor network of the connectorized substrate 10. The resistor network may be a differential or single-ended network including pull-up resistors and has at each end of the circuit a conductive sphere 51 which connects to ground and conductive sphere 52 which connects to power.

FIG. 3 shows a side cut-away view of FIG. 2 taken at line 3—3. The substrate 20 is shown having conductive traces 31,32. The first layer adhered to the substrate 20 also includes conductive pad 34. Adhered to the conductive pad 34 is solder pad 40 and adhered to the solder pad is conductive sphere 50. Adhered between the conductive traces 31,32 and the conductive pads 34 are resistors 61,62, 63.

FIG. 4 discloses a side elevation cut-away view of FIG. 2 taken at line 4—4. The substrate 20 includes conductive pads 34 mounted thereto having the solder paste 40 mounted thereto and the conductive sphere 50 mounted to the solder paste 40. Also mounted to the conductive pad 34 and adjacent thereto is resistor 62. It can be seen in FIG. 4 that the array of conductive spheres 50 are generally uniform in diameter and, therefore, have points of attachment which are coplanar to each other. In a preferred embodiment, the conductive spheres have a variation of only ±0.002 inches. Therefore, problems of coplanarity are avoided and the height of each conductive sphere above the surface of the substrate is approximately equal. Therefore, upon attachment of the connectorized substrate 10 to a motherboard where the surface of the motherboard is planar, all of the conductive spheres 50 will provide electrical connection and no intermittency problems will occur. FIG. 4 also discloses that other components may be mounted to the substrate 20. Attached to the first side 21 of the substrate may be such components as a capacitor 90, voltage regulator 80 or switching diodes or switching transistors. These components may be surface mounted to solder pads 42 or 44 on the first side 21 of the substrate 20 and connected to the conductive network of the substrate 20. In such an arrangement, the connectorized substrate 20 of the present invention may provide for a substrate having a multitude of functions. Any active components may be mounted to the connectorized substrate 20. The placement of the components on the first side 21 of the substrate 20 may be arranged so that an open space on the first side 21 remains so that the substrate may be robotically pick-and-placed to the desired location on the motherboard. The planar open space on the first side 21 of the substrate 20 allows for the attachment of the suction elements of pick-and-place machinery.

FIG. 5 shows a motherboard 100 having the connectorized substrate 10' mounted thereto. The connectoreeed substrate 10' is flipped so that the second side 22 faces the motherboard 100 and the conductive spheres 50 are adjacent thereto. As discussed above, the connectorized substrate 10' may be robotically pick-and-placed onto the desired location of the motherboard 100 so that the conductive spheres 50 of the connectorized substrate 10' are located above the individual corresponding conductive pads and solder pads of the motherboard 100. The motherboard, having the connectorized substrate 10 thereon, may then be exposed to heat in order to reflow the solder pads of the motherboard to provide for the rigid attachment of the connectorized substrate 10' thereto and provide for electrical connection of the circuit. In an embodiment, the motherboard 100 assembly may be a terminator to terminate the signal lines of a bus. The motherboard 100 may have an array of contacts 101 mounted thereon in order to connect the motherboard to another component. The motherboard 100 may also include a second connectorized substrate 10" identical to the first connectorized substrate 10'.

It may be understood that attachment of the connectorized substrate 10' to the motherboard provides for an offset between the motherboard 100 and the substrate 20 of the connectorized substrate 10'. The offset is equal to the diameter of the conductive spheres 50. Thus, in the preferred embodiment, the substrate 20 will be offset from the motherboard 100 by 0.035 inches, as this is the diameter of the conductive spheres 50. This offset between the substrate 20 and the motherboard 100 allows for washing of the components. A wash such as water may be flowed between the motherboard and the first connectorized substrate 10' and the second connectorized substrate 10", in order to remove any fluxes to avoid future corrosion. The advantages of the present invention having the attachment of the connectorized substrate to the motherboard 100 via the conductive spheres 50 allows for such washing.

In certain circumstances, the offset between the connectorized substrate 10' and the motherboard 100 also allows for visual inspection of the connection therebetween. Although in the preferred embodiment shown in FIGS. 1–4, the conductive spheres 50 are mounted along the center of the substrate 20, it is possible that the conductive spheres 50 may be mounted along the 13 edges of the substrate 20 so that upon attachment to the motherboard 100, visual inspection of the connection may be more easily conducted. It may also be apparent from the above description of the invention that the conductive spheres 50 may alleviate any problems which may arise due to the different coefficients of expansion between the substrate 20 and the motherboard 10. For example, the motherboard 100 may be formed of FR4 and the substrate 20 of the connectorized substrate 10' may be formed of ceramic. Each of these materials have a coefficient of expansion for FR4 of approximately 18 PPM/° C. and for ceramic approximately 8 PPM/° C. Upon exposure to varying temperatures, the materials will expand at different rates. In prior art embodiments such expansion could cause the connectonzed substrate to lose electrical connection with the motherboard or the cause other problems such as microcracking of the solder joint or the ceramic substrate. Having the conductive spheres 50 providing for the attachment between the two materials allows for the non-uniform expansion of the materials without severing or overstressing the electrical connections. The conductive spheres 50 may expand or contract due to various temperature changes and as well, the connection of the conductive spheres 50 to the solder paste 40 of the substrate 20 and the solder paste of the motherboard 100 will allow for some expansion and contraction. Therefore, it may be understood that the present invention provides for a connectorized substrate such as a resistor network. However, connectorized substrates having other functions may also be provided by the present invention.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A connectorized resistor network comprising:

a ceramic substrate having a first side;

conductive traces carried by the substrate;

conductive pads mounted to the substrate and connected to the conductive traces;

solder paste connected to the conductive pads, the solder paste comprising a material having a first melting point;

a resistor network carried by the substrate connected to the conductive pads, the resistor network comprising thick-film resistors screend onto the first side of the substrate; and a plurality of discrete conductive spheres comprising a material having a second melting point greater than the first melting point of the solder paste, the solder paste being re-flowed to bond the conductive spheres to the conductive pads, thereby forming a plurality of electrical contact leads extending from the first side of the substrate, whereby the resistor network may be selectively connected to electrical circuitry mounted on a separate substrate.

2. The connectorized substrate of claim 1 wherein the solder paste has a melting point of between 400° F. and 425° F.

3. The connectorized substrate of claim 1 wherein the conductive spheres have a composition of approximately five to fifteen percent tin and eighty-five to ninety-five percent lead.

4. The connectorized resistor network of claim 1 wherein the conductive spheres have a composition of approximately ten percent tin and approximately ninety percent lead.

5. The connectorized resistor network of claim 1 wherein the conductive spheres have a diameter of 0.035 inches ±0.002 inches.

6. The connectorized resistor network of claim 1 wherein a voltage regulator is connected to the conductive traces.

7. The connectorized resistor network of claim 1 wherein a capacitor is connected to the conductive traces.

8. The connectorized substrate of claim 1 wherein the conductive traces and the resistive network are both located on the first surface of the substrate.

* * * * *